(12) United States Patent
Yasumoto et al.

(10) Patent No.: US 7,577,191 B2
(45) Date of Patent: Aug. 18, 2009

(54) APPARATUS FOR AUTOMATICALLY DETECTING BER MEASUREMENT SIGNAL

(75) Inventors: Akira Yasumoto, Yokohama (JP);
Susumu Akada, Yokohama (JP);
Minoru Nishiyama, Yokohama (JP)

(73) Assignee: Leader Electronics Corporation, Yokohama-shi, Kanagawa (JP)

( * ) Notice: Subject to any disclaimer, the term of this patent is extended or adjusted under 35 U.S.C. 154(b) by 672 days.

(21) Appl. No.: 11/275,118

(22) Filed: Dec. 12, 2005

(65) Prior Publication Data

US 2006/0140261 A1 Jun. 29, 2006

(30) Foreign Application Priority Data

Dec. 27, 2004 (JP) ............................. 2004-376123

(51) Int. Cl.
*H04L 27/06* (2006.01)
*H04L 27/00* (2006.01)

(52) U.S. Cl. ...................................... 375/224; 375/340

(58) Field of Classification Search ................. 375/340, 375/224–227, 316
See application file for complete search history.

(56) References Cited

U.S. PATENT DOCUMENTS 7,305,025 B2 * 12/2007 Yamaguchi et al. ......... 375/226
2005/0024543 A1 * 2/2005 Ramaswamy et al. ....... 348/723

OTHER PUBLICATIONS 7706A-001 TS Transmission Tester; *Eiden Catalog*; http://www.eiden-gp-co.jp/products-html/e7706a.htm.

* cited by examiner

*Primary Examiner*—Tesfaldet Bocure
(74) *Attorney, Agent, or Firm*—Fish & Richardson P.C.

(57) ABSTRACT

An apparatus comprises input means, detection means and a selector, and automatically detects a kind of serial signal used in BER measurement. The input means receives at least two signals which include a data signal, and a clock signal having a period corresponding to one bit of the data signal. The detection means determines which one of the at least two signals is a clock signal or a data signal. The selector outputs the signal determined to be a clock signal from a clock signal terminal and outputs the signal determined to be a data signal from a data signal terminal.

10 Claims, 8 Drawing Sheets

APPARATUS FOR AUTOMATICALLY DETECTING BER MEASUREMENT SIGNAL

BACKGROUND OF THE INVENTION

The present invention relates to an apparatus for automatically detecting a kind of serial signal used in BER (Bit Error Rate) measurement, and more particularly to an apparatus for automatically detecting a clock signal, a data signal, a sync signal and a validity signal from among four kinds of serial signals outputted from an apparatus for demodulating a modulated signal, and outputting the detected signals to a BER measurement apparatus.

Conventional BER measurement apparatuses, such as "7706A-001 TS TRANSMISSION TESTER" available from EIDEN Co., Ltd., are provided with four input terminals for receiving a clock signal, a data signal, a sync signal and a validity signal (refer to the outside view of the product shown in Non-patent Document 1 described below). Based on a clock signal, a data signal, a sync signal and a validity signal supplied to the four terminals, the conventional BER measurement apparatus measures BER of the data signal.

[Nonpatent Document 1] EIDEN Co., Ltd., "7706A-001 TS TRANSMISSION TESTER."

SUMMARY OF THE INVENTION

Conventional demodulation apparatuses are generally provided with four output terminals for outputting a clock signal, a data signal, a sync signal and a validity signal. Therefore, when the four output terminals (the output terminal for a clock signal, for example) are not connected via cables to corresponding input terminals (an input terminal for a clock signal, for example), respectively, then the conventional BER measurement apparatus cannot perform BER measurement. Also, it is time-consuming for a user to connect the four output terminals, respectively, to the corresponding input terminals.

An object of the present invention is to provide an apparatus for making it possible to perform BER measurement even when a predefined signal is not supplied to a predefined input terminal.

Another object of the present invention is to provide an apparatus for which the user needs not to pay attention to the wiring when preparing for BER measurement.

The other objects of the present invention will become evident for those skilled in the art by referring to the embodiment of the present invention described below, as well as to the appended drawings.

According to the present invention, there is provided an apparatus (40) which automatically detects a kind of serial signal used in BER measurement. The apparatus (40) of the present invention includes: input means (41) for receiving at least two signals, one of the at least two signals being a data signal, the other one of the at least two signals being a clock signal having a period corresponding to one bit of the data signal; detection means (42) for detecting a kind of the at least two signals supplied to the input means (41), and determining which one of the at least two signals is a clock signal and which one of the at least two signals is a data signal; and a selector (43) which outputs the signal determined to be a clock signal from a clock signal terminal, and outputs the signal determined to be a data signal from a data signal terminal.

The at least two signals may be three signals further including a validity signal indicating a valid portion of the data signal. The detection means (42) can further determine a validity signal from among the three signals, and the selector (43) can further output the signal determined to be a validity signal from a validity signal terminal.

The three signals may be four signals further including a sync signal indicating a header data portion of the data signal. The detection means (42) can further determine a sync signal from among the four signals, and the selector (43) can further output the signal determined to be a sync signal from a sync signal terminal.

DESCRIPTION OF THE PREFERRED EMBODIMENT

Figure 1:
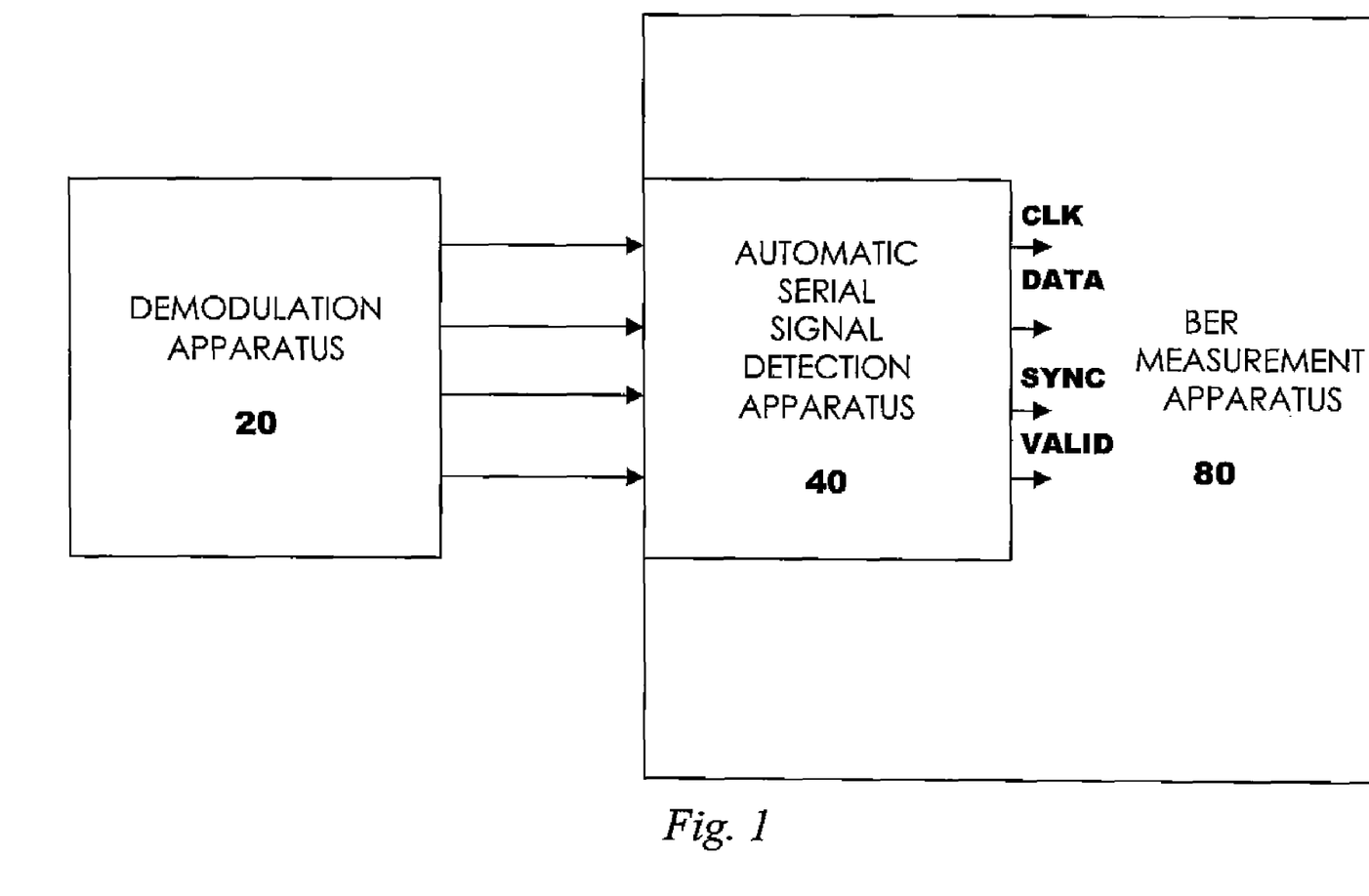
FIG. 1 is a view showing an exemplary configuration of a system for measuring BER.
Figure 2:
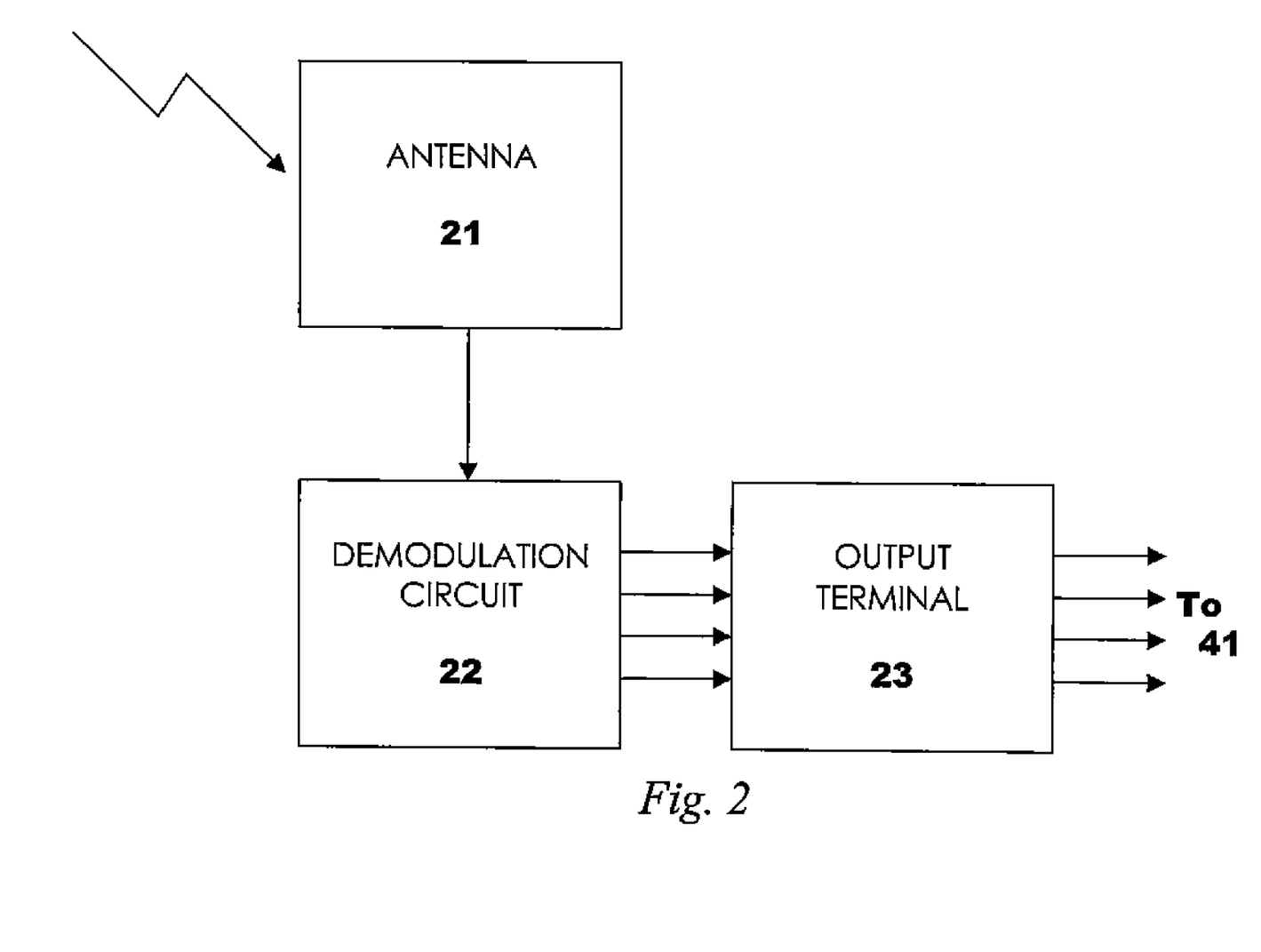
FIG. 2 is a view showing an exemplary configuration of a demodulation apparatus 20.
Figure 3:
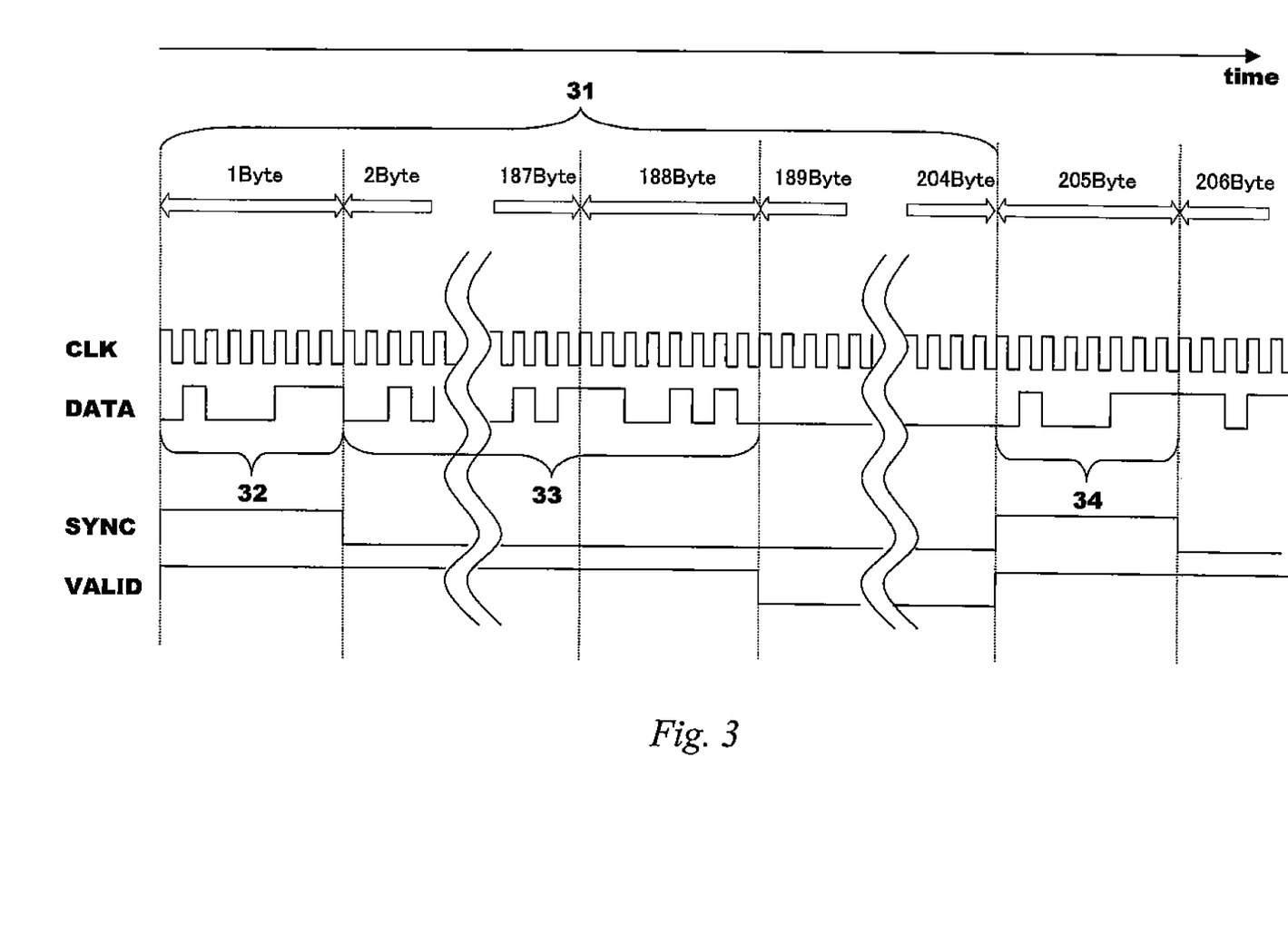
FIG. 3 is a view for explaining a clock signal, a data signal, a sync signal and a validity signal generated by the demodulation apparatus 20.

FIG. 1 is a view showing an exemplary configuration of a system for measuring BER. FIG. 2 is a view showing an exemplary configuration of a demodulation apparatus 20 of FIG. 1. FIG. 3 is a view for explaining a clock signal, a data signal, a sync signal and a validity signal generated by the demodulation apparatus 20.

As shown in FIG. 1, the system for measuring BER includes a demodulation apparatus 20 and a BER measurement apparatus 80 having included therein an automatic serial signal detection apparatus 40.

For example, in FIG. 2, an input unit (an antenna 21, for example) of the demodulation apparatus 20 receives a signal obtained by encoding and modulating (QPSK modulation, for example) MPEG-2TS data. A demodulation circuit 22 of the demodulation apparatus 20 demodulates the encoded and modulated signal, and generates a clock signal indicating a timing for outputting serial data, a data signal synchronized with the clock signal, a validity signal indicating a valid portion of the data, and a sync signal indicating prescribed data (header data) of the data.

It is possible for the demodulation circuit 22 to generate only three signals, except for a sync signal, from among the four signals, or alternatively, to generate only two signals, except for a validity signal and sync signal.

For example, as shown in FIG. 3, the clock signal has a prescribed period; and the prescribed period corresponds to the minimum unit (one bit) of a data signal.

A data signal has prescribed data (for example, reference numerals 32 and 34 in FIG. 3) each prescribed packet size (for example, 204 bytes in FIG. 3). In the case that a data signal has data in MPEG-2TS format, the prescribed data (header data) of a data signal is "01000111" representing 47 (Hex). In the case that a data signal has data in MPEG-2TS format, the prescribed packet size is 204 bytes as shown in FIG. 3 (reference numeral 31 in FIG. 3) or 188 bytes (not shown).

For example, in FIG. 3, the validity signal indicates that the data signal is valid from the first byte to the 188-th byte. The sync signal indicates the prescribed data (header data) positioned in the first byte.

In the valid portion of the data signal, the valid portion includes pseudo-random noise (PN) data (for example, reference numeral 33 in FIG. 3) for BER measurement.

In FIG. 2, an output unit (output terminal 23, for example) of the demodulation apparatus 20 outputs signals (a clock signal, a data signal, a sync signal and a validity signal; or alternatively a clock signal, a data signal, and a validity signal; or alternatively a clock signal and a data signal) generated by the demodulation circuit 22.

In a case where the demodulation circuit 22 shown in FIG. 2 generates a clock signal, a data signal, a sync signal and a validity signal, the output terminal 23 is constituted of four output terminals. In a case where the demodulation circuit 22 shown in FIG. 2 generates a clock signal, a data signal and a validity signal, the output terminal 23 is constituted of three output terminals. In a case where the demodulation circuit 22 shown in FIG. 2 generates a clock signal and a data signal, the output terminal 23 is constituted of two output terminals.

Figure 4:
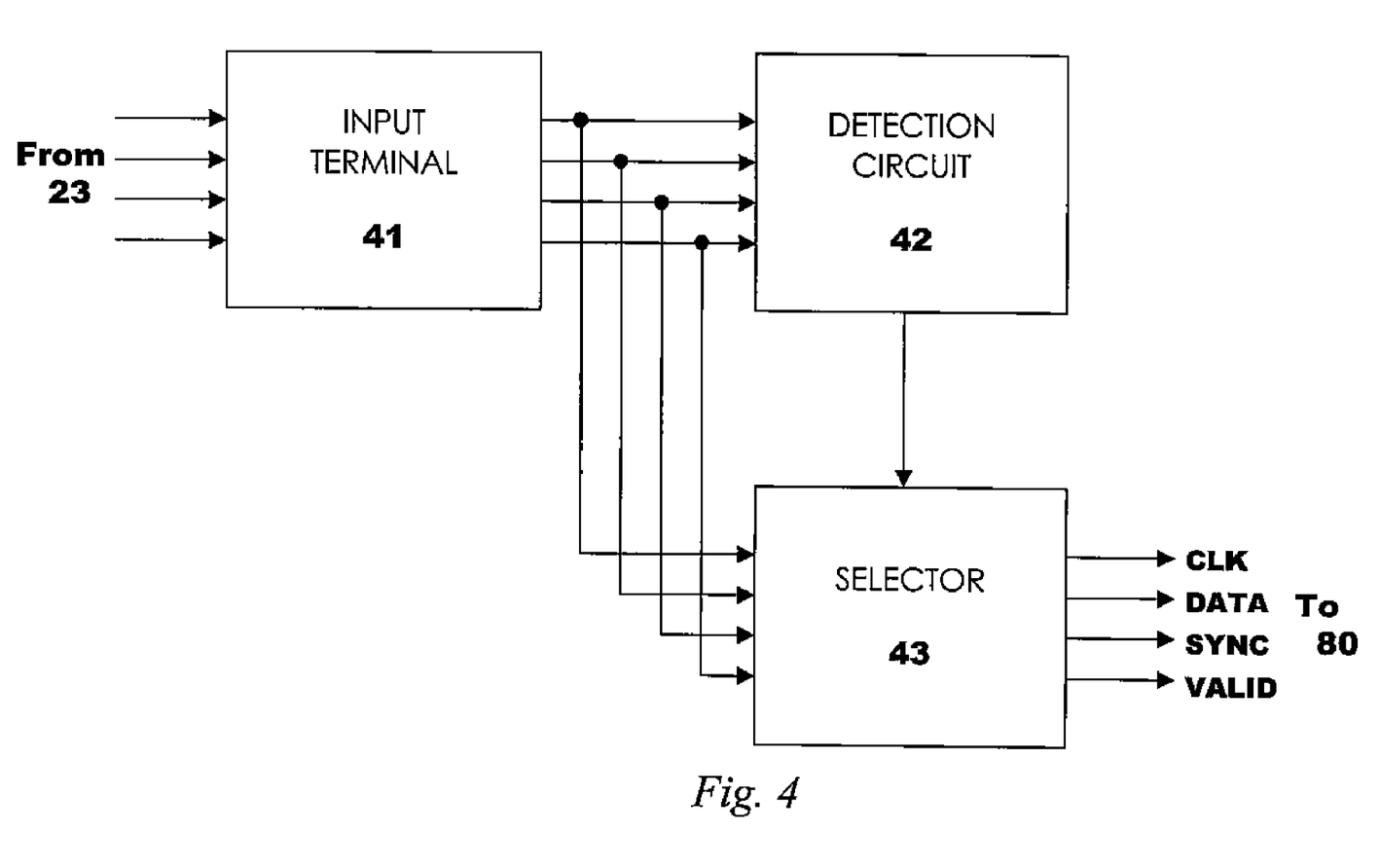
FIG. 4 is a view showing an exemplary configuration of an automatic signal detection apparatus 40 of a BER measurement apparatus 80.

FIG. 4 is a view showing an exemplary configuration of the automatic serial signal detection apparatus 40 of the BER measurement apparatus 80. In FIG. 4, an input unit (input terminal 41, for example) of the automatic serial signal detection apparatus 40 receives signals (a clock signal, a data signal, a sync signal and a validity signal; or alternatively a clock signal, a data signal, and a validity signal; or alternatively a clock signal and a data signal) outputted from the demodulation apparatus 20 and outputs the received signals to a detection circuit 42 and a selector 43.

The input terminal 41 of the automatic serial signal detection apparatus 40 shown in FIG. 4 is constituted of four input terminals. The user can freely connect the four output terminals constituting the output terminal 23 of FIG. 2, respectively, to the four input terminals constituting the input terminal 41. More specifically, the user can connect, for example, the output terminal for a clock signal to any one of the four input terminals.

The detection circuit 42 detects the kind of serial signal outputted from the demodulation apparatus 20, and outputs a detection information signal indicating the kind of each signal to the selector 43. For example, the detection information signal indicates that signals supplied to the first to fourth input terminals constituting the input terminal 41 are a data signal, a validity signal, a clock signal and a sync signal, respectively.

The selector 43 receives signals outputted from the demodulation apparatus 20 via the input terminal 41, and also receives a detection information signal from the detection circuit 42. Based on the detection information signal, the selector 43 outputs from the corresponding dedicated terminals, the signals outputted from the demodulation apparatus 20. For example, in a case where a data signal, a validity signal, a clock signal and a sync signal are supplied to the first to fourth input terminals constituting the input terminal 41, respectively, the selector 43 outputs from a dedicated terminal for a clock signal, the clock signal supplied via the third terminal, and outputs from a dedicated terminal for data signal, the data signal supplied via the first terminal, and outputs from a dedicated terminal for a sync signal, the sync signal supplied via the fourth terminal, and outputs from a dedicated terminal for a validity signal, the validity signal supplied via the second terminal.

In FIG. 1, a BER measurement unit, except the automatic serial signal detection apparatus 40, of the BER measurement apparatus 80 receives a clock signal, a data signal, a sync signal and a validity signal outputted from (the selector 43 of) the automatic serial signal detection apparatus 40. The BER measurement unit includes a unit for generating pseudo-random data and a unit for synchronizing the unit for generating pseudo-random data with pseudo-random data extracted from a data signal outputted from the automatic serial signal detection apparatus 40. The BER measurement unit extracts pseudo-random data contained in the data signal from the clock, data, sync and validity signals, and compares the extracted pseudo-random data with the pseudo-random data generated by the BER measurement apparatus 80 to thereby measure BER. When there is no sync signal, the BER measurement unit extracts pseudo-random data from the clock, data and validity signals. Also, when there is neither a sync signal nor a validity signal, the BER measurement unit extracts pseudo-random data from the clock and data signals. The technique for extracting pseudo-random data is known, and hence detailed explanation thereof is omitted here.

Figure 5:
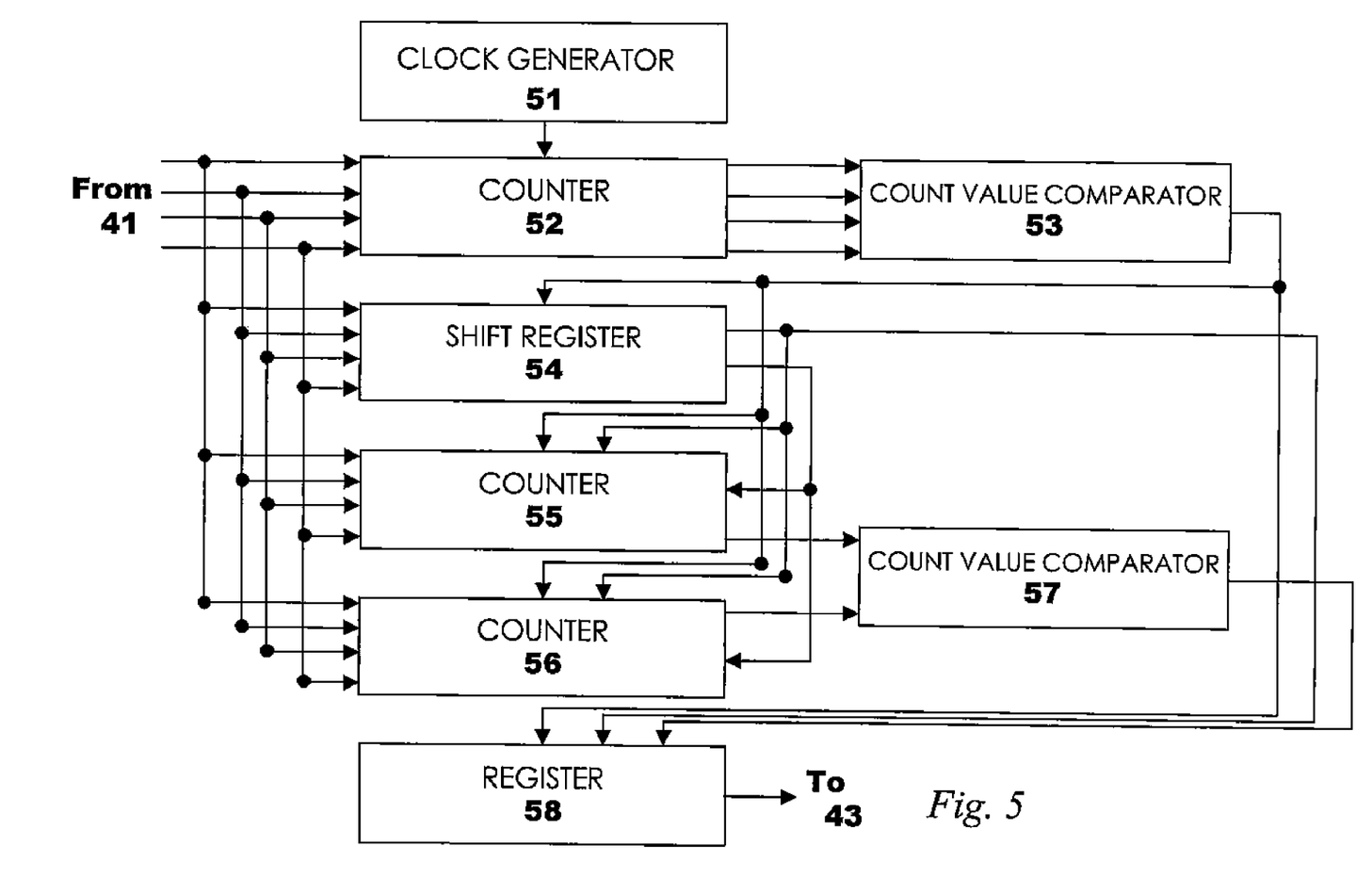
FIG. 5 is a view showing an exemplary configuration of a detection circuit 42.
Figure 6:
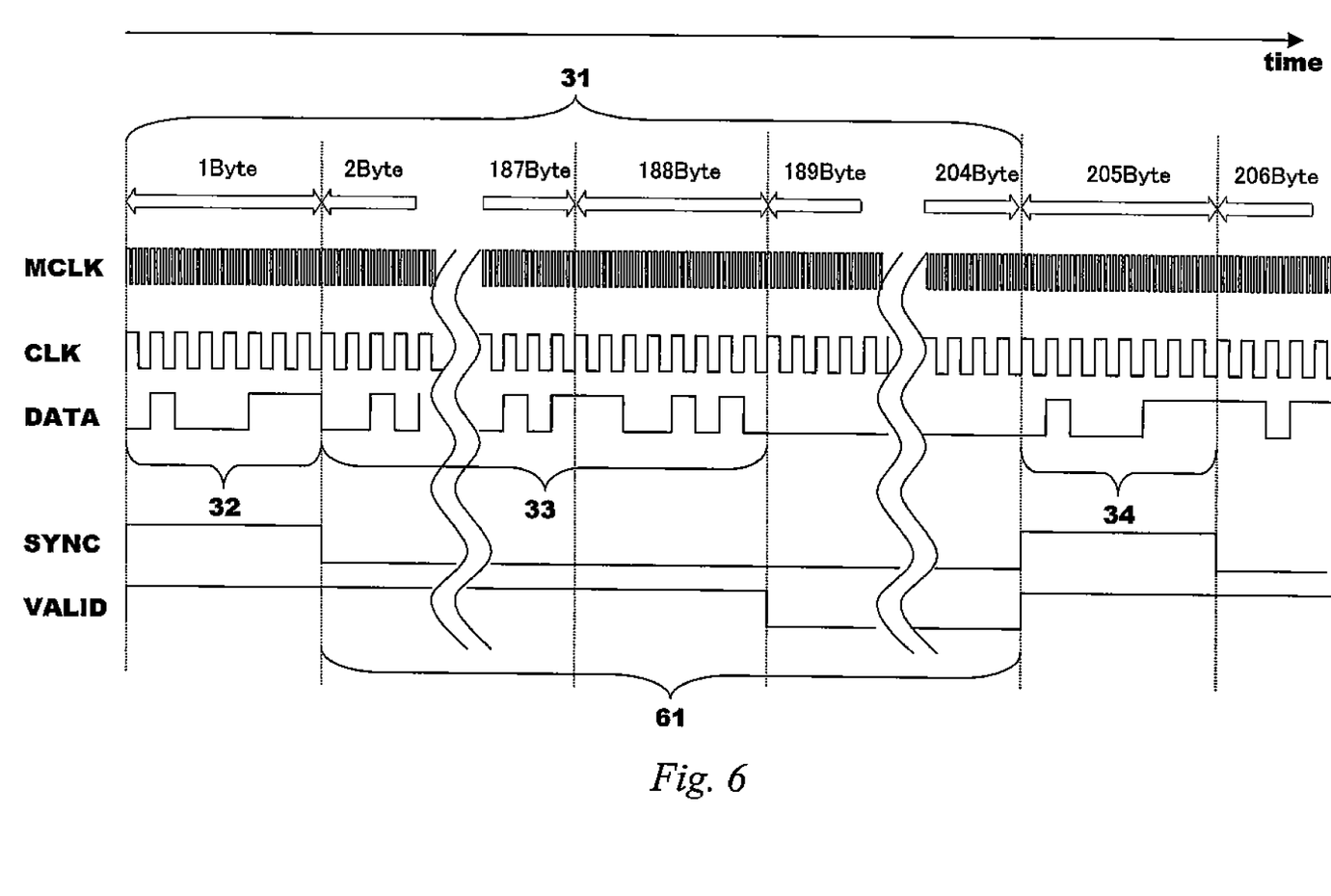
FIG. 6 is a view for explaining a master clock signal generated by a master clock generation circuit 51.

FIG. 5 is a view showing an exemplary configuration of the detection circuit 42 of FIG. 4. In FIG. 5, a master clock generation circuit 51 of the detection circuit 42 generates a master clock (MCLK) signal and outputs it to a level change counter 52. The period (Tmc) of the master clock signal is smaller than half the period (Tc) of a clock signal generated by the demodulation circuit 22 (Tmc<Tc/2). FIG. 6 is a view obtained by adding a master clock signal generated by the master clock generation circuit 51 to FIG. 3.

In FIG. 5, the level change counter 52 receives a master clock signal from the master clock generation circuit 51, and also receives from the input terminal 41 shown in FIG. 4 the signals (a clock signal, a data signal, a sync signal and a validity signal; or alternatively a clock signal, a data signal and a validity signal; or alternatively a clock signal and a data signal) outputted from the output terminal 23 of FIG. 2. When the input terminal 41 is constituted of the first to fourth input terminals, the level change counter 52 receives a clock signal, a data signal, a sync signal and a validity signal. The connection between the output terminal 23 and the input terminal 41 can be freely determined by the user, so the level change counter 52 itself cannot identify which signal (a clock signal, a data signal, a sync signal or a validity signal) is supplied to each of the first to fourth input terminals constituting the input terminal 41.

The level change counter 52 counts by use of the master clock signal, changes of levels of the signals received from each of the first to fourth input terminals constituting the input terminal 41. For example, each time the master clock signal indicates HIGH, the level change counter 52 determines whether a signal at the first input terminal is HIGH or LOW, and further compares the result to a determination result indicating whether the signal at the first input terminal was HIGH or LOW when the master clock signal previously indicated HIGH. Consequently, only when the current determination result is different from the previous determination result, does the level change counter 52 make a count. More specifically, each time the master clock signal indicates HIGH, the level change counter 52 determines whether the signal at the first input terminal varies from HIGH to LOW, or from LOW to HIGH, and makes a count only when the signal at the first input terminal varies. As for the second to fourth input terminals, also, the level change counter 52 similarly counts the changes of level of each signal. In short, the level change counter 52 counts by use of the master clock signal, the changes of levels of signals received from each of the first to fourth input terminals constituting the input terminal 41.

The level change counter 52 counts by use of the master clock signal, the change of level of each signal of the first to fourth input terminals constituting the input terminal 41, and at the time when any of the count values reaches a certain value (100, for example), each of the count values is outputted to a comparator 53.

In the comparator 53, the count values corresponding to each of the first to fourth input terminals constituting the input terminal 41 are compared to each other to determine which count value is largest. Further, the comparator 53 outputs to a shift register 54, counters 55 and 56, and a register 58, a comparison result information signal indicating to which one of the first to fourth input terminals the largest count value corresponds. Referring to FIG. 6, it can be understood that a signal whose level varies most frequently is a clock signal.

The shift register 54 receives from the comparator 53, the comparison result information signal indicating to which one of the first to fourth input terminals constituting the input terminal 41 a clock signal corresponds, and further receives from the input terminal 41, the signals supplied to the first to fourth input terminals constituting the input terminal 41. Based on the comparison result information signal, the shift register 54 determines the input terminal (the third input terminal, for example) corresponding to a clock signal, and stores by use of the clock signal, each of the signals of the input terminals (the first, second and fourth input terminals, for example) corresponding to the signals, except for the clock signal, by the number of bits of predetermined data (header data) of the data signal. When the data signal is of MPEG-2TS format, the predetermined data of the data signal is "01000111" representing 47 (Hex). Accordingly, in this case, the shift register 54 stores by 8 bits, each of the signals of the input terminals (the first, second and fourth input terminals, for example) corresponding to the signals, except for the clock signal. Each time the clock signal indicates HIGH, the shift register 54 determines whether each 8 bit of the signals of the input terminals (the first, second and fourth input terminals, for example) corresponding to the signals, except for the clock signal, indicates "01000111". When detecting predetermined data ("01000111", for example) of the data signal, the shift register 54 generates a detection timing signal. Further, the shift register 54 outputs to the signal status counters 55 and 56, together with the detection timing signal, a detection result information signal indicating the input terminal (the first input terminal, for example) at which a predetermined data (header data) of the data signal was detected. The shift register 54 also outputs the detection result information signal to the register 58.

The signal status counters 55 and 56 each receive from the comparator 53, the comparison result information signal indicating to which one of the first to fourth input terminals constituting the input terminal 41 a clock signal corresponds, and receive from the shift register 54, the detection result information signal indicating to which one of the first to fourth input terminals constituting the input terminal 41 a data signal corresponds, and further receive from the shift register 54, the detection timing signal indicating the timing when a predetermined data (header data) of the data signal was detected. The signal status counters 55 and 56 each further receive from the input terminal 41, the signals supplied to the first to fourth input terminals constituting the input terminal 41.

Based on the comparison result information signal and the detection result information signal, the signal status counters 55 and 56 each determine the input terminals (the third and first input terminals, for example) corresponding to a clock signal and a data signal. The signal status counters 55 and 56 each further count by use of the clock signal, the HIGH status of each of the signals of the input terminals (the second and fourth input terminals, for example) corresponding to the signals except the clock and data signals. At this time, the signal status counters 55 and 56 each count the HIGH status of each of the signals of the input terminals (the second and fourth input terminals, for example) from a time when the detection timing signal is received from the shift register 54 to a time corresponding to the predetermined packet size (for example, 204 bytes denoted by reference numeral 31 in FIG. 6). The signal status counters 55 and 56 each outputs their count value to the comparator 57.

The comparator 57 compares the count values each corresponding to the signal status counters 55 and 56, and determines a smaller count value. The comparator 57 further outputs to the register 58, a second comparison result information signal indicating to which one of the first to fourth input terminals the smaller count value corresponds. Referring to FIG. 6, it can be understood that a signal having the smaller count value of the HIGH status is a sync signal (refer to reference numeral 61).

The register 58 receives from the comparator 53, the comparison result information signal indicating to which one of the first to fourth input terminals constituting the input terminal 41 a clock signal corresponds, and receives from the shift register 54, the detection result information signal indicating to which one of the first to fourth input terminals constituting the input terminal 41 a data signal corresponds, and further receives from the comparator 57, the second comparison result information signal indicating to which one of the first to fourth input terminals constituting the input terminal 41 a sync signal corresponds.

Based on the comparison result information signal, the detection result information signal and the second comparison result information signal, the register 58 determines the input terminals (the third, first and fourth input terminals, for example) corresponding to the clock, data and sync signals. The register 58 further determines that a remaining input terminal (the second input terminal, for example) corresponds to a validity signal. The register 58 outputs to the selector 43 of FIG. 4, a detection information signal indicating to which one of the first to fourth input terminals each of clock signal, data signal, sync signal and validity signal corresponds.

Figure 7:
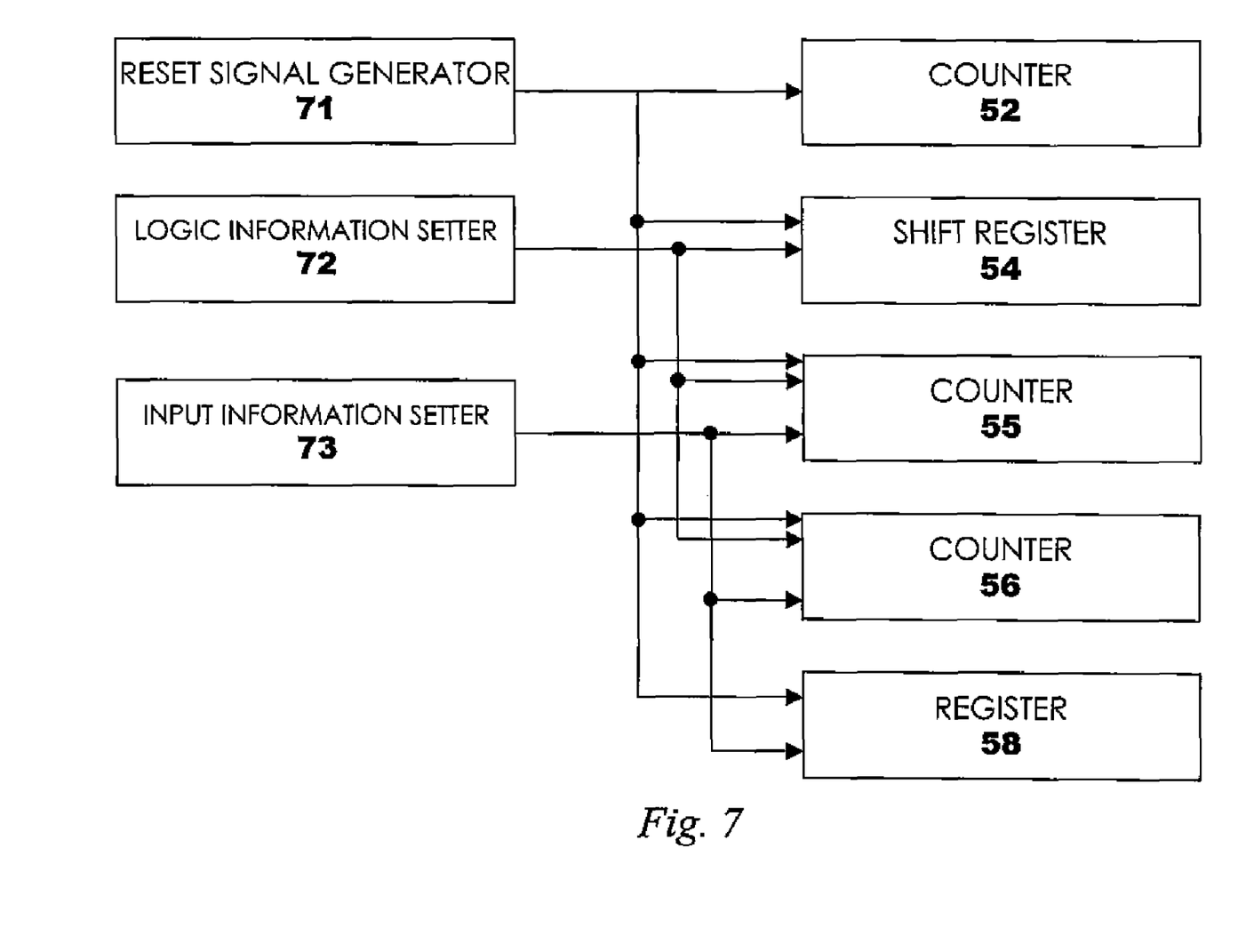
FIG. 7 is a view showing remaining components constituting the detection circuit 42.

FIG. 7 shows a reset signal generation unit 71, a logic information setting unit 72 and an input information setting unit 73 which are added to the exemplary configuration (FIG. 5) of the detection circuit 42 shown in FIG. 4.

The reset signal generation unit 71 generates a signal for resetting the count values of the level change counter 52 and the signal status counters 55 and 56, as well as the register values of the shift register 54 and the register 58. More specifically, the reset signal generation unit 71 is provided with a reset button; when detecting that the reset button is selected by the user, the unit 71 generates a reset signal. By selecting the reset button, the user can initialize the apparatus 40 which automatically detects the kind of serial signal.

The logic information setting unit 72 indicates whether the data signal, sync signal and validity signal generated by the demodulation circuit 22 are based on positive logic or on negative logic. The data signal, sync signal and validity signal shown in FIGS. 3 and 6 are based on positive logic. It will be understood that, if the data signal, sync signal and validity signal generated by the demodulation circuit 22 are negative logic, the HIGH status of the signals shown in FIGS. 3 and 6 will change to LOW status. More specifically, the logic information setting unit 72 is provided with, for example, a negative logic button; when detecting that the negative logic button is selected by the user, the unit 72 generates a logic information signal indicating negative logic, and outputs the signal to the shift register 54 and the signal status counters 55 and 56. When receiving the logic information signal indicating negative logic, the shift register 54 detects inverted data of predetermined data (header data) of the data signal ("10111000" obtained by inverting "01000111", for example). Also, the signal status counters 55 and 56 each count the LOW status of each of the signals of the input terminals (the second and fourth input terminals, for example) corresponding to the signals, except for the clock signal and data signal.

The input information setting unit 73 generates a signal indicating the number of signals supplied to the four input terminals constituting the input terminal 41 of FIG. 4, i.e., the number of signals generated by the demodulation circuit 22 of FIG. 2, and outputs the signal to the register 58. In a case where a clock signal, a data signal, a sync signal and a validity signal are generated by the demodulation circuit 22, the input information setting unit 73 generates a signal indicating that four signals are supplied to the input terminal 41. In this case, the detection circuit 42 (the signal status counters 55 and 56, the comparator 57 and the register 58) operates as described above.

In a case where a clock signal, a data signal and a validity signal are generated by the demodulation circuit 22, the input information setting unit 73 generates a signal indicating that three signals are supplied to the input terminal 41. In this case, the signal status counters 55 and 56, the comparator 57 and the register 58 operate as described below. The operation of the signal status counters 55 and 56 stops. Accordingly, the comparator 57 does not output to the register 58 a second comparison result information signal indicating to which one of the first to fourth input terminals constituting the input terminal 41 a sync signal corresponds. Based on a comparison result information signal and a detection result information signal, the register 58 determines the input terminals (the third and first input terminals, for example) corresponding to clock and data signals. The register 58 further determines that a remaining input terminal (the second terminal, for example) corresponds to a validity signal. The register 58 outputs to the selector 43 of FIG. 4, a detection information signal indicating to which one of the first to fourth input terminals each of clock signal, data signal and validity signal corresponds.

In a case where a clock signal and a data signal are generated by the demodulation circuit 22, the input information setting unit 73 generates a signal indicating that two signals are supplied to the input terminal 41. In this case, the signal status counters 55 and 56, the comparator 57 and the register 58 operate as described below. The operation of the signal status counters 55 and 56 stops, and thus the comparator 57 does not output a second comparison result information signal to the register 58. Based on a comparison result information signal and a detection result information signal, the register 58 determines the input terminals (the third and first input terminals, for example) corresponding to clock and data signals. The register 58 outputs to the selector 43 of FIG. 4, a detection information signal indicating to which one of the first to fourth input terminals each of clock signal and data signal corresponds.

Figure 8:
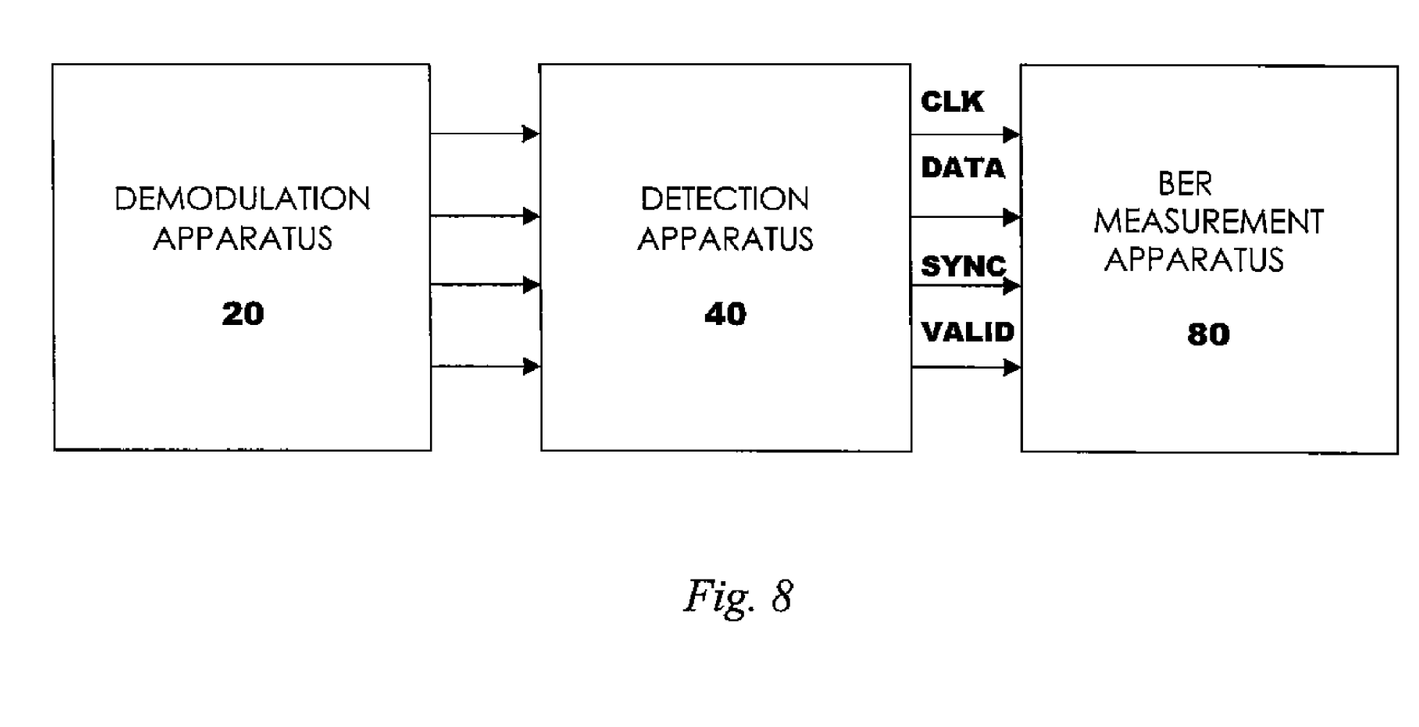
FIG. 8 is a view showing another exemplary configuration of the system for measuring BER.

The present invention is not limited to the embodiment described above. Those skilled in the art will recognize that many modifications to the embodiments described above are possible within the scope of the invention, which is defined in the appended claims. For example, as shown in FIG. 8, the automatic detection apparatus 40 may be positioned outside the BER measurement apparatus 80.

What is claimed is:

1. An apparatus which automatically detects a kind of serial signal used in BER measurement, the apparatus comprising:
   input means for receiving at least two signals, one of the at least two signals being a data signal, and the other one of the at least two signals being a clock signal having a period corresponding to one bit of the data signal;
   detection means for receiving the at least two signals supplied to the input means, and determining which one of the at least two signals is the clock signal and which one of the at least two signals is the data signal; and
   a selector configured to receive the at least two signals supplied to the input means, output the signal determined to be the clock signal from a clock signal terminal, and output the signal determined to be the data signal from a data signal terminal.

2. The apparatus according to claim 1, wherein:
   the at least two signals comprise three signals, one of the three signals being a validity signal indicating a valid portion of the data signal;
   the detection means determines which one of the three signals is the validity signal; and
   the selector is configured to output the signal determined to be the validity signal from a validity signal terminal.

3. The apparatus according to claim 1, wherein:
   the at least two signals comprise four signals, one of the four signals being a validity signal indicating a valid portion of the data signals and another one of the four signals being a sync signal indicating a header data portion of the data signal;
   the detection means determines which one of the four signals is the validity signal and which one of the four signals is the sync signal; and
   the selector is configured to output the signal determined to be the validity signal from a validity signal terminal, and to output the signal determined to be the sync signal from a sync signal terminal.

4. The apparatus according to claim 1, wherein the input means receives the at least two signals from a demodulation apparatus that generated the at least two signals.

5. The apparatus according to claim 1, wherein the apparatus is incorporated in a BER measurement apparatus.

6. The apparatus according to claim 1, wherein the data signal is an MPEG-2TS transport stream.

7. The apparatus according to claim 1, wherein:
   the detection means includes means for counting one or more changes of levels of each of the at least two signals, and means for comparing the counts corresponding to the at least two signals to each other to identify the highest count; and
   the detection means determines that a signal corresponding to the highest count is the clock signal.

8. The apparatus according to claim 7, wherein:
   the detection means includes means for detecting that the other of the at least two signals that is not determined to be the clock signal includes a header data portion; and
   the detection means determines that the other signal including the header data portion is the data signal.

9. The apparatus according to claim 8, wherein:
   the at least two signals comprise three signals, one of the three signals being a validity signal indicating a valid portion of the data signal;

the detection means determines that the other of the three signals that is not determined to be the clock signal or the data signal is the validity signal; and the selector is configured to output the signal determined to be the validity signal from a validity signal terminal.

10. The apparatus according to claim 8, wherein:

the at least two signals comprise four signals, one of the four signals being a validity signal indicating a valid portion of the data signal, and another one of the four signals being a sync signal indicating a header data portion of the data signal;

the detection means includes means for counting a LOW status of each of the two signals of the four signals that is not determined to be the clock signal or the data signal, and means for comparing the counts of the two signals to each other to identify the lowest count;

the detection means determines that the one of the two signals corresponding to the lowest count is the sync signal, and determines a that the other of the two signals is the validity signal; and the selector is configured to output the signal determined to be the validity signal from a validity signal terminal, and outputs the signal determined to be the sync signal from a sync signal terminal.

* * * * *